(12) United States Patent
Zhu et al.

(10) Patent No.: US 7,262,084 B2
(45) Date of Patent: Aug. 28, 2007

(54) METHODS FOR MANUFACTURING A FINFET USING A CONVENTIONAL WAFER AND APPARATUS MANUFACTURED THEREFROM

(75) Inventors: Huilong Zhu, Poughkeepsie, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 10/709,129

(22) Filed: Apr. 15, 2004

(65) Prior Publication Data

US 2005/0233565 A1    Oct. 20, 2005

(51) Int. Cl.
*H01L 21/335* (2006.01)
(52) U.S. Cl. ...................... 438/142; 438/585
(58) Field of Classification Search ......... 438/585, 438/595, 737, 739, 752, 753, 142, 156, 182, 438/212
See application file for complete search history.

(56) References Cited

U.S. PATENT DOCUMENTS

| | | | |
|---|---|---|---|
| 6,300,182 B1 | 10/2001 | Yu | |
| 6,391,695 B1 | 5/2002 | Yu | |
| 6,403,434 B1 | 6/2002 | Yu | |
| 6,413,802 B1 | 7/2002 | Hu et al. | |
| 6,451,656 B1 | 9/2002 | Yu et al. | |
| 6,475,869 B1 | 11/2002 | Yu | |
| 6,475,890 B1 | 11/2002 | Yu | |
| 6,492,212 B1 | 12/2002 | Ieong et al. | |
| 6,521,502 B1 | 2/2003 | Yu | |
| 6,525,403 B2 | 2/2003 | Inaba et al. | |
| 6,562,665 B1 | 5/2003 | Yu | |
| 6,580,137 B2 | 6/2003 | Parke | |
| 6,583,469 B1 | 6/2003 | Fried et al. | |
| 6,605,514 B1 | 8/2003 | Tabery et al. | |
| 6,610,576 B2 | 8/2003 | Nowak | |
| 6,611,029 B1 | 8/2003 | Ahmed et al. | |
| 6,642,090 B1 | 11/2003 | Fried et al. | |
| 6,727,186 B1 * | 4/2004 | Skotnicki et al. | 438/734 |
| 2003/0102497 A1 | 6/2003 | Fried et al. | |

* cited by examiner

*Primary Examiner*—Quoc Hoang
(74) *Attorney, Agent, or Firm*—Ohlandt, Greeley, Ruggiero & Perle, L.L.P.; Joseph P. Abate, Esq.

(57) ABSTRACT

A method is provided for producing a fin structure on a semiconductor substrate using a thin SiGe layer to produce a void between a silicon substrate and a silicon fin portion. A fin structure produced by such a method is also provided.

18 Claims, 13 Drawing Sheets

METHODS FOR MANUFACTURING A FINFET USING A CONVENTIONAL WAFER AND APPARATUS MANUFACTURED THEREFROM

BACKGROUND OF INVENTION

The present invention relates generally to the field of semiconductor manufacturing. More particularly, the present invention relates to fin field effect transistors and a method for manufacturing the same.

The need to remain cost and performance competitive in the production of semiconductor devices has driven integrated circuits to increased device density. To facilitate the increase in device density, new technologies are constantly needed to allow the feature size of these semiconductor devices to be reduced.

The push for ever increasing device densities is particularly strong in CMOS technologies such as in the design and fabrication of field effect transistors (FETs). FETs are the dominant components of complementary metal oxide semiconductors (CMOS). Scaling FETs to attain higher device density in CMOS results in degradation of short channel effect and/or reliability.

One type of FET that has been proposed to improve short channel effect and facilitate increased or not decrease device density is a fin Field Effect Transistor ("finFET"). In finFETs, the body of the transistor is formed from a vertical structure, generally referred to as a "fin" for its resemblance to the dorsal fin on a fish. The gate of the finFET is then formed on one or more sides of the fin. FinFETs have several advantages, including better current control without requiring increased device size. FinFETs thus facilitate scaling of CMOS dimensions while maintaining an acceptable performance.

FinFETs are generally produced using silicon-on-insulator (SOI) wafers. While the use of SOI wafers provides needed isolation for finFETs, it is not without significant drawbacks. The most compelling drawback of forming finFETs from SOI wafers is the added costs for SOI wafers compared to bulk silicon wafers. For example, SOI wafers can commonly cost two to three times the cost of bulk silicon wafers. This increased cost of SOI wafers, while acceptable for some applications, is prohibitive in others. Additionally, the use of SOI wafers is not compatible with all fabrication processes, such as commonly used SiGe processes.

Thus, there is a need for a method of producing finFETs using the lesser expensive bulk semiconductor substrates.

SUMMARY OF INVENTION

It is an object of the present invention to provide a method of producing a fin structure for a finFET.

It is another object of the present invention to provide a method of producing a fin structure for a finFET that is cost effective.

It is yet another object of the present invention to provide a method of producing a fin structure for a finFET without the use of an SOI wafer.

It is still yet another object of the present invention to provide a method of producing a fin structure for a finFET using conventional bulk semiconductor materials.

It is a further object of the present invention to provide a method of producing a fin structure for a finFET using a Si/SiGe/Si substrate.

It is yet a further object of the present invention to provide a fin structure for a field effect transistor comprising a silicon fin attached to a support structure, the support structure attached to a semiconductor substrate such that a void exists between the silicon fin and the semiconductor substrate.

To accomplish the foregoing objects and advantages, the present invention, in brief summary, is a method of producing a fin structure on a semiconductor substrate using an epi strained thin SiGe layer to produce a void between a silicon substrate and a silicon fin portion, and a fin structure produced thereby.

BRIEF DESCRIPTION OF DRAWINGS

FIG. 3 shows a perspective view of a fin portion of a silicon layer suspended above a semiconductor substrate with a void there between.

DETAILED DESCRIPTION

The present invention provides a method of producing a fin structure on a semiconductor substrate using a thin SiGe layer to produce a void between a silicon substrate and a silicon fin portion. A portion of silicon layer in the shape of the desired fin structure is suspended above the semiconductor substrate by a supporting structure, while a portion of the SiGe layer is removed to form a void that either remains as a void in the completed FinFET or is filled with an insulating material.

The use of conventional wafers, such as a silicon wafer, in the method of the present invention decreases the cost of producing FinFET's over the use of an SOI substrate. The method of the present invention also allows for the production of fin widths that are smaller than what is possible using traditional photolithography. Using photolithography alone, widths of fin structures are limited by the resolution of the photolithography, typically 30 nanometers (nm). However, the method of the present invention allows for fin widths at least as narrow as about 10 nm, without the use of the more expensive SOI techniques.

Figure 1:
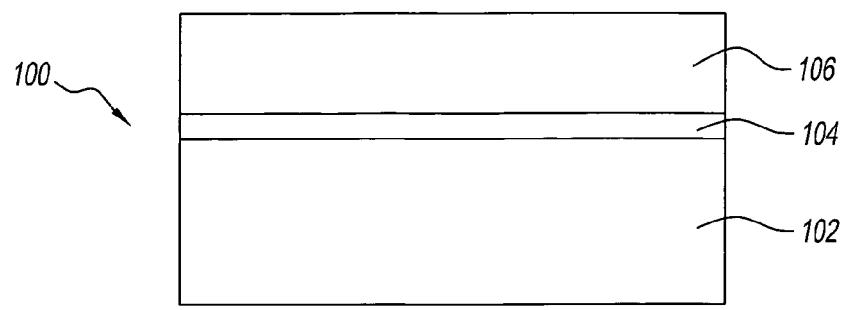
FIG. 1 shows a cross sectional view of an Si/SiGe/Si structure.

Referring to the drawings and, in particular FIG. 1, a conventional semiconductor substrate generally represented by reference numeral 102, such as a conventional silicon wafer, is provided. On the semiconductor substrate 102 is a thin silicon germanium (SiGe) layer 104. The SiGe layer 104 may be an epitaxial grown layer. The SiGe layer 104 is a single crystal layer, which is strained to provide a matching lattice constant to the semiconductor substrate 102. On the SiGe layer 104, opposite semiconductor substrate 102, is provided a silicon layer 106. The silicon layer 106 can also be a single crystal layer. These three components provide an Si/SiGe/Si structure 100, as shown in FIG. 1. In another embodiment (not shown), the SiGe layer 104 is produced by germanium implantation in a conventional silicon semiconductor wafer. High temperature annealing is used to remove implantation damage and to form a layer of buried SiGe in the silicon wafer to provide the Si/SiGe/Si structure 100 having a semiconductor substrate 102, an SiGe layer 104, and a silicon layer 106.

The layer thickness for semiconductor substrate 102 can be any thickness that is mechanically strong enough to support a chip.

The layer thickness for SiGe layer 104 can be from about 10 nm to about 30 nm. Preferably, the layer thickness for SiGe layer 104 can be from about 20 nm to about 25 nm. More preferably, the layer thickness for SiGe layer 104 can be from about 20 nm to about 25 nm.

The layer thickness for silicon layer 106 can be from about 30 nm to about 100 nm. Preferably, the layer thickness for silicon layer 106 can be from about 40 nm to about 80 nm. More preferably, the layer thickness for silicon layer 106 can be from about 50 nm to about 70 nm.

Figure 2:
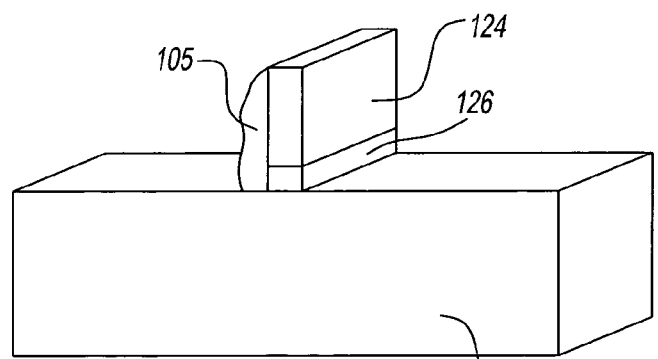
FIG. 2 shows a perspective view of a fin portion of a silicon layer and a portion of an SiGe layer defined above a semiconductor substrate, and a support structure attached to the fin portion and the semiconductor substrate.

In FIG. 2, fin portion 124 of silicon layer 106 has thereunder a second portion 126 of SiGe layer 104. A support structure 105 is connected to fin portion 124 and semiconductor substrate 102. Any support structure that suspends the fin portion 124 above the semiconductor substrate 102 while the second portion 126 of SiGe layer 104 is removed, is suitable. Support structure 105 can be removed prior to completion of the fin structure or can be an integral part of a completed FinFET.

Figure 3:
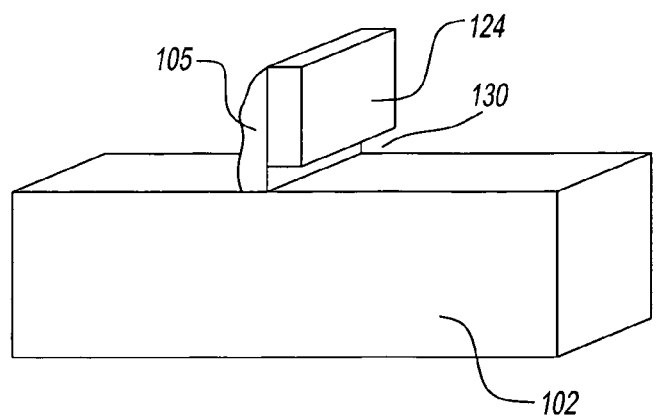

In FIG. 3, second portion 126 of SiGe layer 104 is removed to form a first void 130 between fin portion 124 and semiconductor substrate 102. In one aspect of the present invention, a completed fin structure may retain the first void 130. In another aspect of the present invention, first void 130 may be filled with an insulating material, such as a nitride, an oxide, a low-k dielectric, or any combinations thereof.

Figure 4:
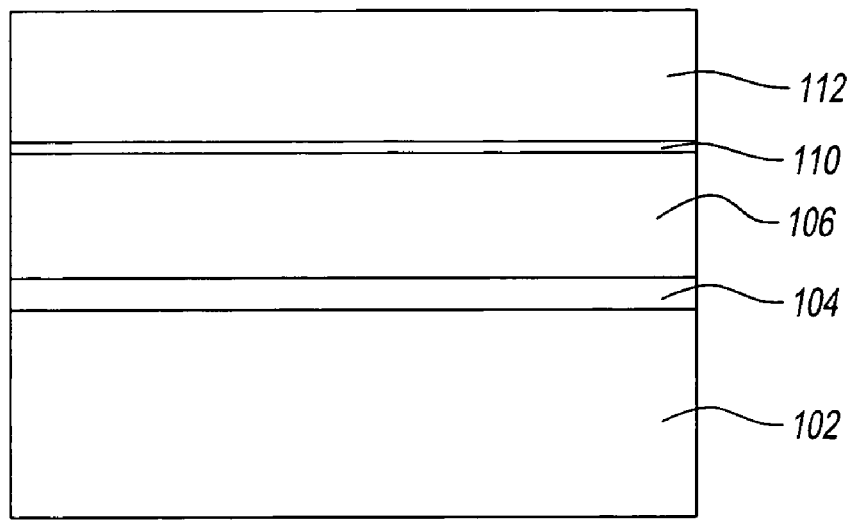
FIGS. 4 to 13 show cross sectional views of portions of a semiconductor structure at various stages of an embodiment of a method of the present invention.

FIGS. 4 to 13 show cross sectional views of portions of a semiconductor structure at various stages of an embodiment of a method of the present invention. An Si/SiGe/Si structure 100, as in FIG. 1, is provided. Referring to FIG. 4, silicon layer 106, opposite SiGe layer 104, has a first blocking layer 110 deposited thereon. The poly-silicon layer 112 may have a layer thickness from about 70 nm to about 120 nm. Examples of suitable materials for the poly-silicon layer 112 include, but are not limited to, poly-silicon, poly-silicon/germanium, nitride, or any combinations thereof.

When the poly-silicon layer is only a poly-silicon, the use of a second blocking layer on the poly-silicon layer 112 can protect the portions of the poly-silicon layer during subsequent etching. Poly-silicon/germanium has a different etch rate and does not require the use of an additional blocking layer on the poly-silicon layer 112.

Examples of materials that can be used in or for the first blocking layer 110 include, but are not limited to, a nitride, an oxide, oxynitride, or any combinations thereof. The layer thickness for first blocking layer 110 can be from about 5 nm to about 10 nm. Preferably, the layer thickness for first blocking layer 110 can be from about 8 nm to about 10 nm. More preferably, the layer thickness for first blocking layer 110 can be from about 9 nm to about 10 nm.

Figure 5:
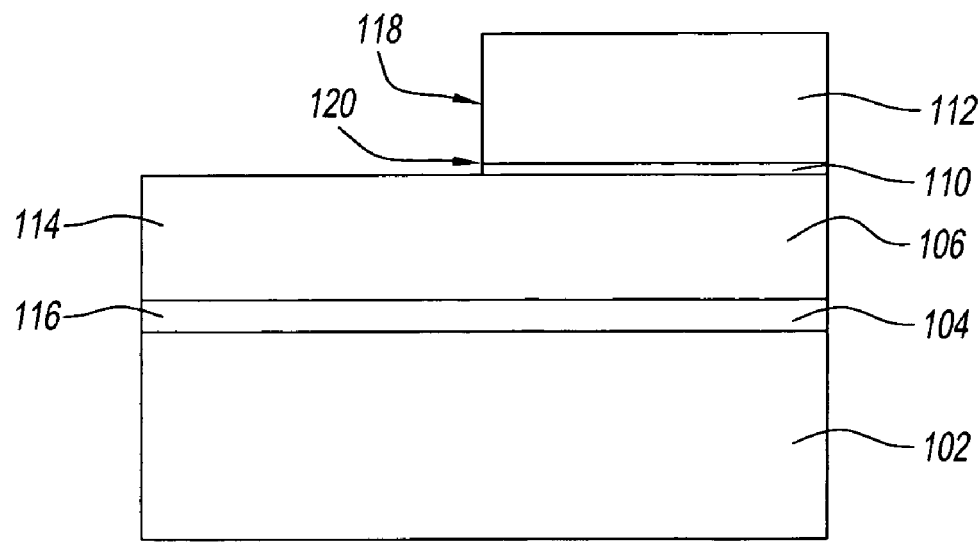

With reference to FIG. 5, poly-silicon layer 112 and the first blocking layer 110 are patterned to reveal a first portion 114 of silicon layer 106 and a first portion 116 of the SiGe layer 104. This patterning also produces a sidewall 118 of the poly-silicon layer 112 and a sidewall 120 of the first blocking layer 110.

Figure 6:
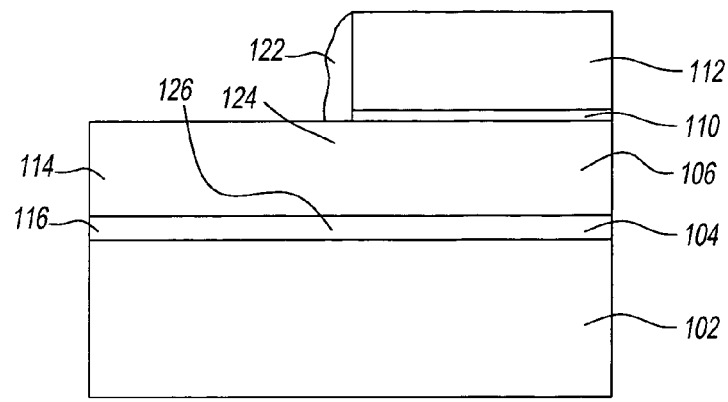

Referring to FIG. 6, the sidewalls 118 and 120 of the poly-silicon layer 112 and first blocking layer 110, respectively, have deposited or formed thereon a first spacer 122. The first spacer 122 may have any suitable material to act as a mask to cover and define thereunder a second portion 124 of the silicon layer 106 and a second portion 126 of the SiGe layer 104. The second portion 124 of the silicon layer 106 will form a part of the fin structure. An example of a material for the first blocking layer includes, but is not limited to, a nitride.

Figure 7:
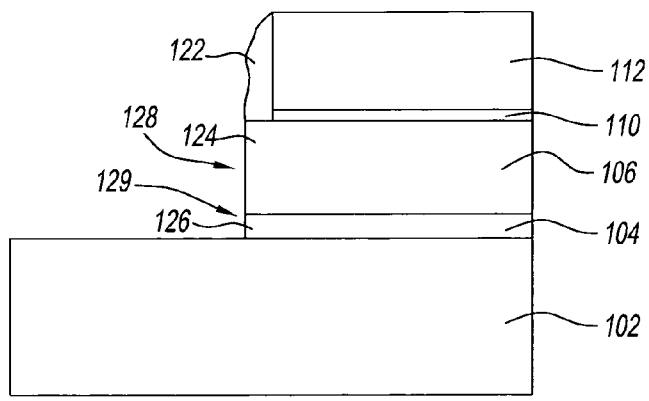

Referring to FIG. 7, the first portion 114 of silicon layer 106, as in FIG. 6, is removed revealing a first sidewall 128 of second portion 124 of silicon layer 106 and leaving the second portion 124 of silicon layer 106. Examples of suitable ways to remove the first portion 114 of silicon layer 106 include, but are not limited to, etching, reactive ion etch (RIE), or any combinations thereof.

The first portion 116 of SiGe layer 104, as in FIG. 6, is removed revealing a first sidewall 129 of SiGe layer 104. Examples of suitable ways to remove the first portion 116 of SiGe layer 104 include, but are not limited to, etching, reactive ion etch, or any combinations thereof. Removal of the first portion 116 of SiGe layer 104 is done selective to the material of semiconductor substrate 102, such that the material of the semiconductor substrate 102 is not removed during the step of removing the first portion 116 of SiGe layer 104.

Figure 8:
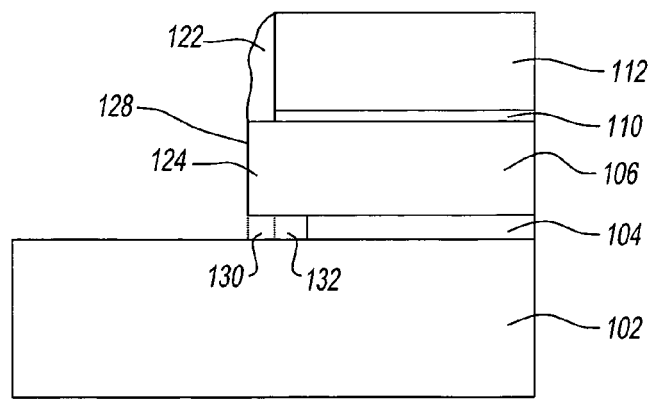

The second portion 126 of SiGe layer 104, as shown in FIG. 7, is removed revealing a first void 130, as shown in FIG. 8, between the semiconductor layer 102 and the second portion 124 of silicon layer 106. Examples of suitable ways to remove second portion 126 of SiGe layer 104 include, but are not limited to, wet etching, RIE, or any combinations thereof. The first void 130 has the volume under the second portion 124 of silicon layer 106. However, additional material 132 of SiGe layer 104 may also be removed during this step. The removal is done selective to the material of semiconductor substrate 102. Some of the second portion 126 of SiGe layer 104 may have already been removed during the step of removing first portion 116 of SiGe layer 104. The remaining SiGe layer 104, silicon layer 106, first blocking layer 110, and poly-silicon layer 112 act to support second portion 124 of silicon layer 106 over first void 130.

Figure 9:
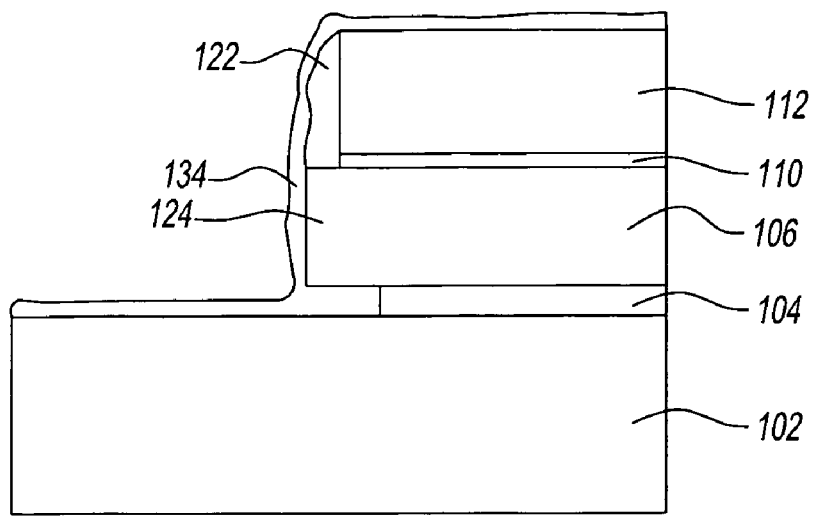

In FIG. 9, a first insulating material 134 is deposited in the first void 130, on the sidewall 128 of second portion 124 of silicon layer 106, and on the first spacer 122. Examples of suitable materials for use in or for first insulating material 134 include, but are not limited to, an oxide, a nitride, oxynitride, low-k material, or any combinations thereof.

Figure 10:
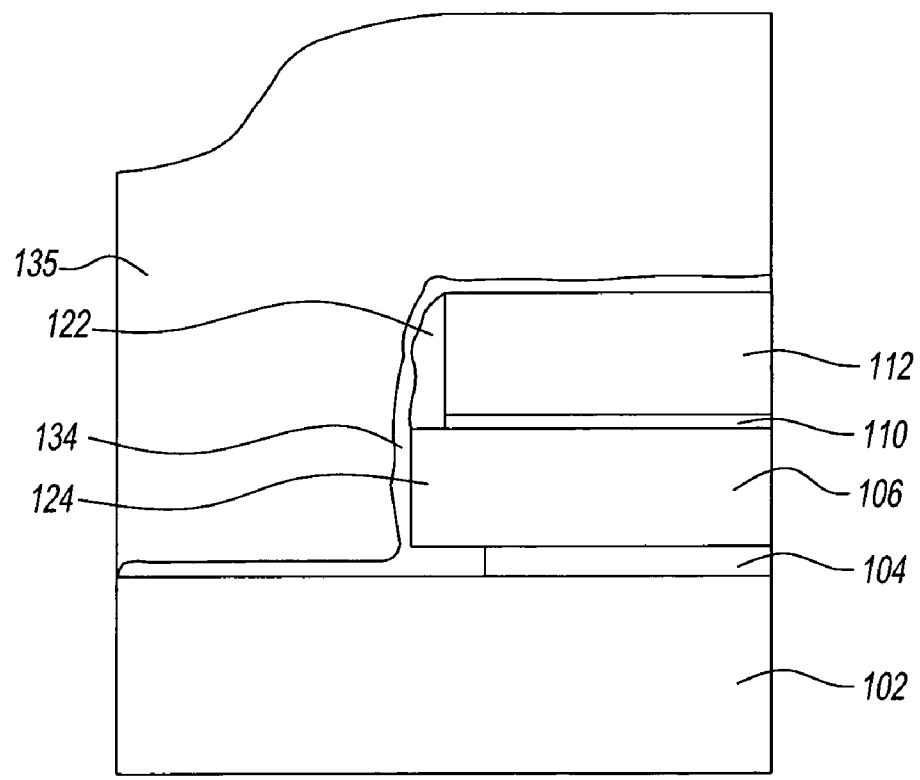

In FIG. 10, a third blocking layer 135 is deposited on first insulating material 134 in order to block subsequent removal of first insulating material 134 during the removal of poly-silicon layer 112 and first blocking layer 110. Examples of suitable materials for use in or for third blocking layer 135 include, but are not limited to, poly-silicon, poly-silicon germanium, or any combinations thereof. The thickness of the third blocking layer 135 is preferably greater than the sum of the thicknesses of the SiGe layer 104, silicon layer 106, first blocking layer 110, and poly-silicon layer 112.

Figure 11:
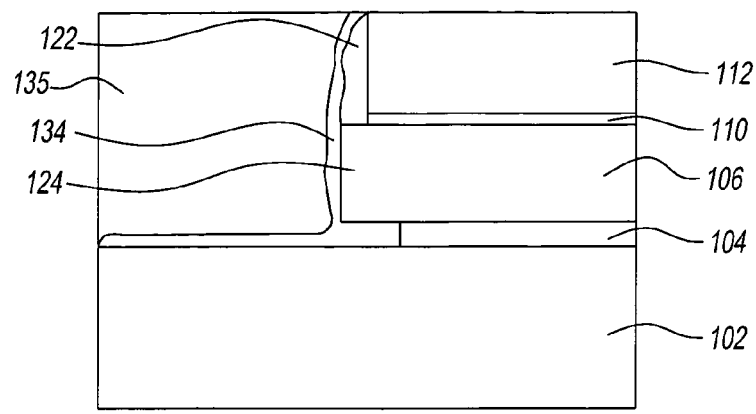

FIG. 11 shows the result of chemical mechanical polishing (CMP) which stops on the top of first spacer 122. This removes first insulating material 134 that is covering the poly-silicon layer 112, and any optional second blocking layer.

Figure 12:
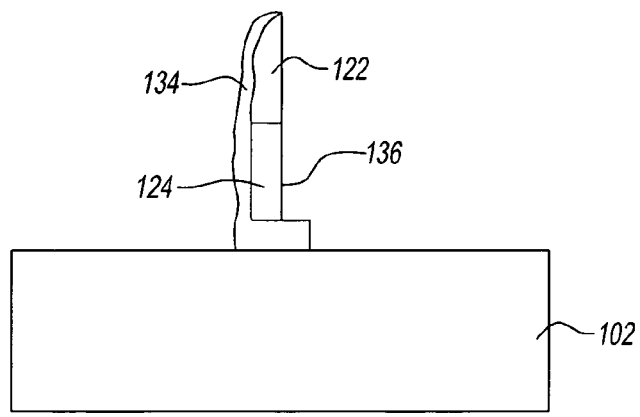

Referring to FIGS. 11 and 12, poly-silicon layer 112, part of third blocking layer 135, and first blocking layer 110 that remain, as in FIG. 11, are removed. Examples of suitable ways to remove poly-silicon layer 112 and first blocking layer 110 include RIE or any conventional dry etch methods. The portion of silicon layer 106 in FIG. 11 that is not part of second portion 124 is removed, revealing a second sidewall 136 of second portion 124 of silicon layer 106, as seen in FIG. 12. An example of a suitable way to remove portions of silicon layer 106 that are not part of second portion 124 includes, but is not limited to, RIE. The remaining SiGe layer 104, as in FIG. 11, is removed. Preferably, this removal is done selective to the material of semiconductor layer 102. Examples of suitable ways to remove remaining SiGe layer 104 include, but are not limited to, wet etching, RIE, or any combinations thereof.

At this point or at a later time, any excess first insulating material 134 covering semiconductor substrate 102 can also be removed. Insulating material 134 will be used to support second portion 124 of silicon layer 106 and first spacer 122 upon the removal of the remaining poly-silicon layer 112, remaining first blocking layer 110, remaining silicon layer 106 that is not a part of second portion 124, and remaining SiGe layer 104. Enough first insulating material 134 must remain to perform this function.

Figure 13:
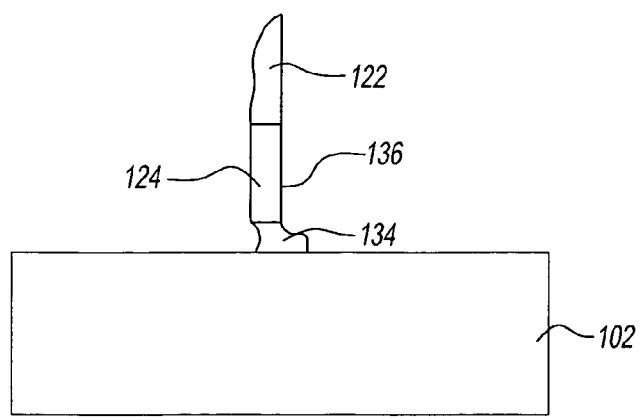

Referring to FIGS. 9 and 10, first insulating material 134 that is not under second portion 124 of silicon layer 106 (that part that is in the first void) is removed. Examples of suitable ways to remove such first insulating material 134 include, but are not limited to, wet etching, dry etch, or any combinations thereof. In one aspect of the present invention, the first insulating material 134 is asymmetrical as shown in FIG. 13.

When the first insulating material 134 is suitable for use as a gate insulating material, such as a gate oxide, it may be desirable to leave first insulating material 134 that is not under second portion 124 of silicon layer 106. In that situation, a second insulating material (not shown) may be deposited using a suitable technique, such as high density plasma deposition (HDP) on sidewall 136 of second portion 124 of silicon layer 106 and other surfaces, such as semiconductor substrate 102 and first spacer 122, prior to etching and formation of FinFET using conventional processes.

Figure 14:
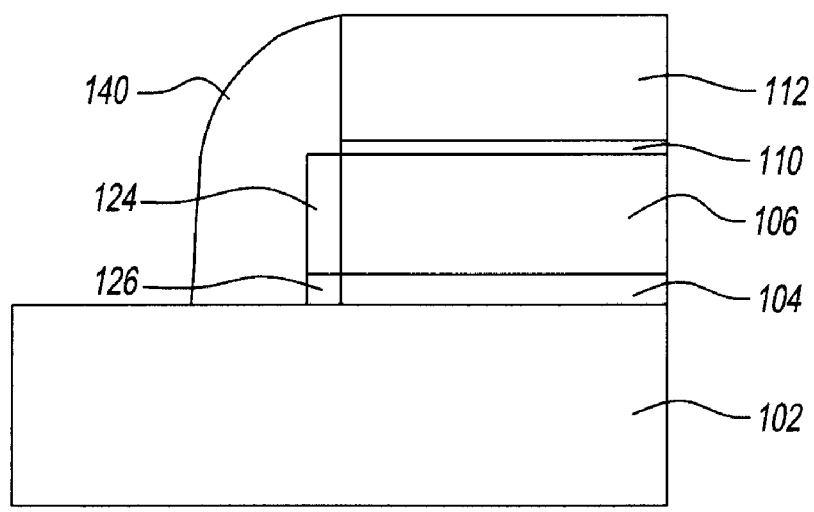
FIGS. 14 to 22 show cross sectional views of portions of a semiconductor structure at various stages of another embodiment of a method of the present invention.

In another embodiment of the present invention, a fin structure is produced using a method similar to that described above. Referring to FIGS. 1, 4 to 7 and 14 to 22, cross sectional views of semiconductor structures at various stages of a method of producing a fin structure are shown. The method involves the same steps as described in the embodiment above up to and including the removal of first portion 116 of SiGe layer 104 as in FIG. 7. Thereafter, on sidewall 118 of poly-silicon layer 112, sidewall 120 of first blocking layer 110, sidewall 128 of second portion 124 of silicon layer 106, and sidewall 129 of second portion 126 of SiGe layer 104, a second spacer 140 is formed as shown in FIG. 14. The second spacer 140 can be of the same or different material as first spacer 122 of FIG. 6. The second spacer 140 can be formed after the removal of all or part of the first spacer or can be formed on top of the existing first spacer. The second spacer 140 can include any suitable material for supporting second portion 124 of silicon layer 106 upon the removal of poly-silicon layer 112, first blocking layer 110, the portion of silicon layer 106 not part of second portion 124, and SiGe layer 104, as will be described in detail below. Examples of materials for use in or for second spacer 140 include, but are not limited to, a nitride, oxynitride, or any combinations thereof.

Figure 15:
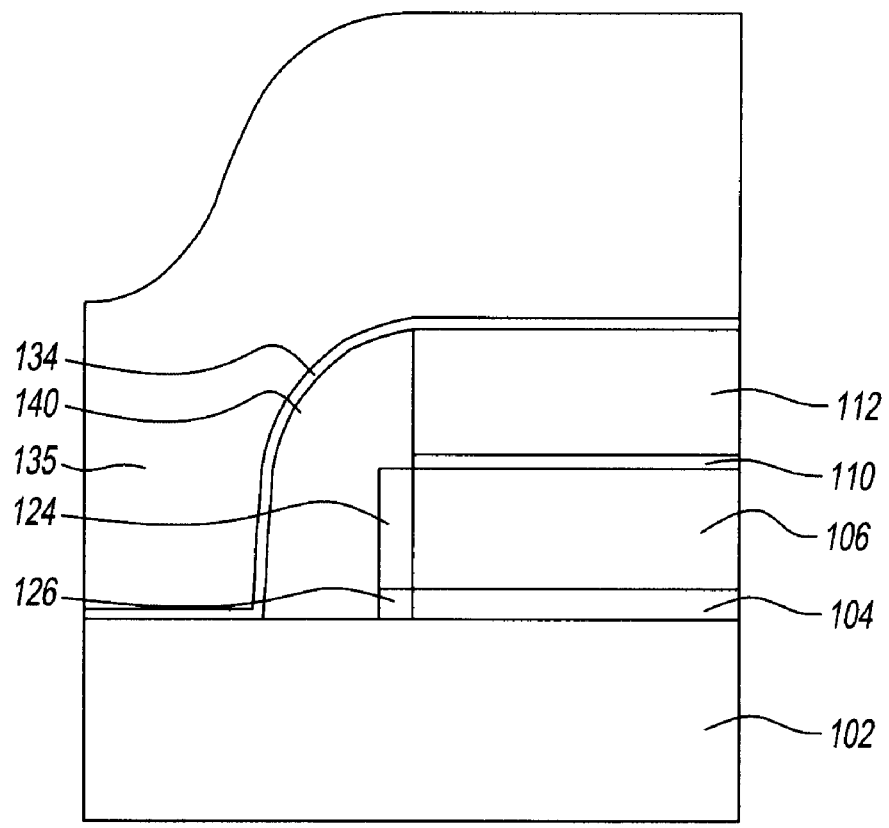

In FIG. 15, first insulating material 134 is deposited on semiconductor substrate 102, second spacer 140, and poly-silicon layer 112. Third blocking layer 135 is deposited on first insulating material 134.

Figure 16:
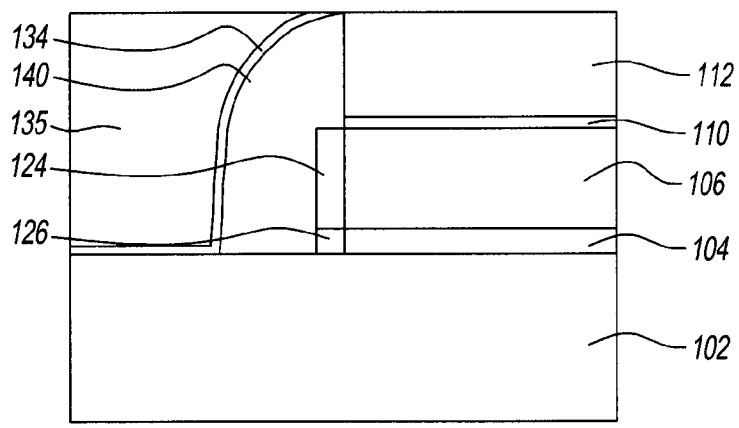

FIG. 16 shows the result of chemical mechanical polishing (CMP) of third blocking layer 135 and first insulating material 134 stopping on the top of second spacer 140.

Figure 17:
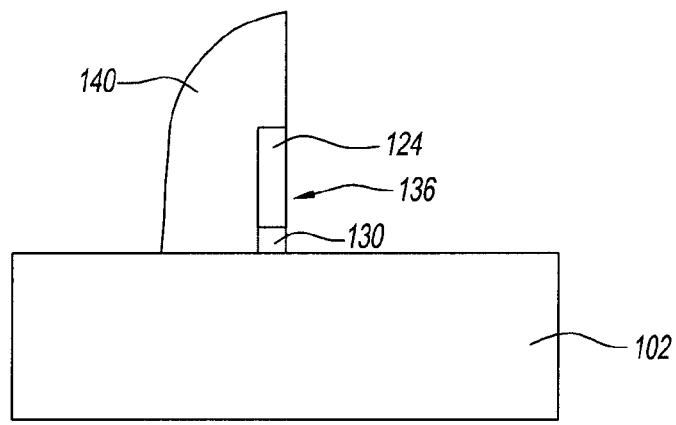
Figure 18:
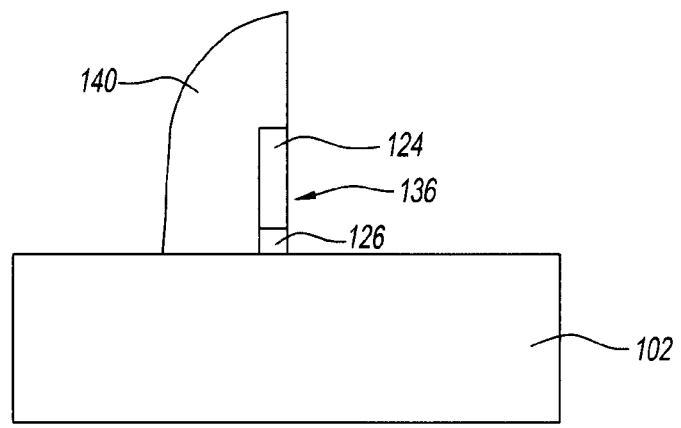

Referring to FIGS. 16 and 17, any optional second blocking layer material (not shown) remaining on poly-silicon layer 112 is removed. Remaining poly-silicon layer 112, third blocking layer 135, and first blocking layer 110 are removed. This removal may be by any suitable way. Examples of ways to remove poly-silicon layer 112 and first blocking layer 110 include, but are not limited to, RIE, dry etch, or any combinations thereof. The portions of silicon layer 106 that are not part of second portion 124 are removed, revealing a second sidewall 136 of second portion 124 of silicon layer 106, as in FIG. 17. This removal may be by any suitable way. Examples of ways to remove portions of silicon layer 106 that are not part of second portion 124 include, but are not limited to, RIE, dry etch, or any combinations thereof.

The first insulating material 134, as in FIG. 14, is removed from first spacer 140 and from semiconductor substrate 102. The SiGe layer 104 that remains, as in FIG. 16, is removed. This removal may be done by any suitable way. Preferably, this removal is done selective to the material of semiconductor layer 102. Examples of ways to remove remaining SiGe layer 104 include, but are not limited to, wet etching, RIE, or any combinations thereof. In one aspect, this removal of the remaining SiGe layer 104 may be done by wet etching, selective to the material of semiconductor substrate 102, to remove the SiGe layer 104 including the second portion 126 of SiGe layer 104 to produce a first void 130 beneath second portion 124 of silicon layer 106 and above semiconductor substrate 102, as in FIG. 17. Second spacer 140 acts as a supporting structure to suspend second portion 124 of silicon layer 106 over semiconductor substrate 102 with first void 130 there between.

Figure 19:
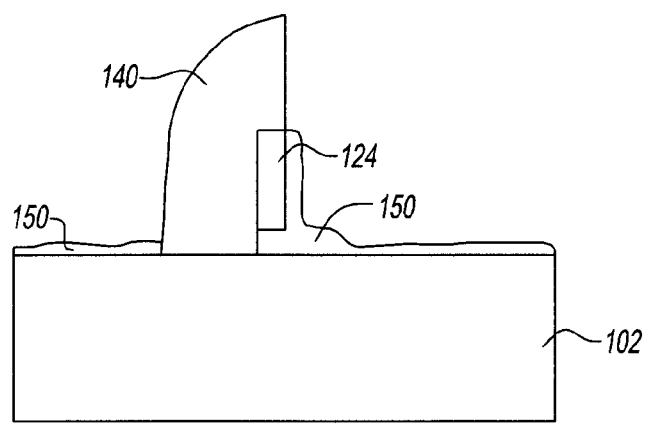

The removal of the remaining SiGe layer 104 may also be done in a step-wise fashion, thereby first removing SiGe layer 104 that is not a part of second portion 126 of SiGe layer 104 first. This removal may be done by etching that part of the SiGe layer 104 selective to the material of the semiconductor layer 102 leaving second portion 126 of SiGe layer 104 in place, as in FIG. 18. Next, enough heat to induce oxidation of the second portion 126 of SiGe layer 104 is applied. An example of an appropriate level of heat to induce oxidation includes, but is not limited to, about 1,000° Celsius (C.) to about 1,200° C. It is believed that the SiGe oxidation occurs at a rate that is much larger (approximately 3.5 times faster) than that of pure silicon, such that the second portion 126 of SiGe layer 104 will turn to oxide earlier than the second portion 124 of silicon layer 106 and the semiconductor substrate 102. FIG. 19 shows the formation of oxidation material 150. The oxidation material 150 is then removed, as in FIG. 20, to reveal first void 130. Second portion 124 of silicon layer 106 is suspended above the semiconductor substrate 102 by the support mechanism of the second spacer 140. Second spacer 140 acts as a supporting structure to suspend second portion 124 of silicon layer 106 over semiconductor substrate 102 with first void 130 therebetween.

Figure 20:
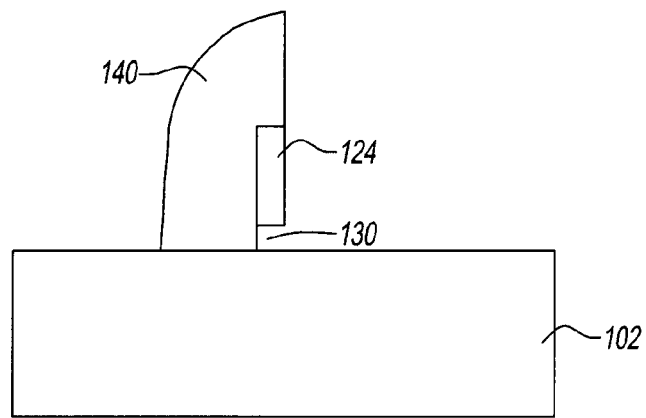
Figure 21:
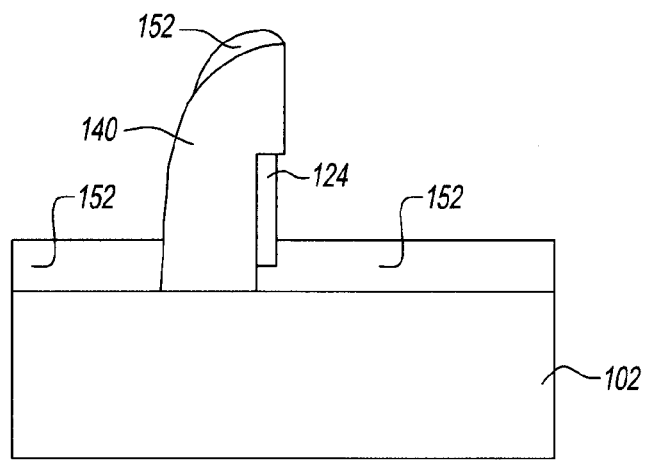

Referring to FIG. 21, in first void 130 of FIG. 17 or 20, a first insulating material 152 is deposited. Examples of suitable ways for depositing first insulating material 152 include, but are not limited to, direct deposition, HDP, or any combinations thereof. Examples of materials for use in or for the first insulating material include, but are not limited to, an oxide, a nitride, low-k material, or any combinations thereof.

Figure 22:
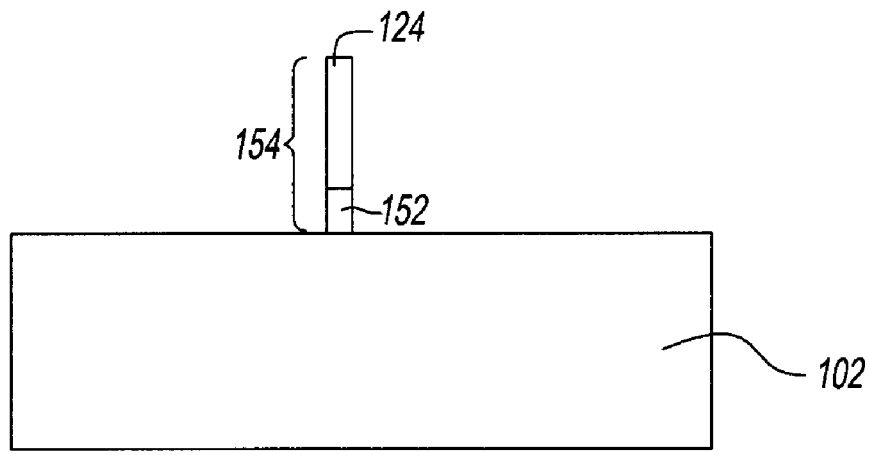

Referring to FIGS. 21 and 22, second spacer 140, as in FIG. 21, is removed. This removal of second spacer 140 may be done by any suitable way. Examples of ways to remove second spacer 140 include, but are not limited to, wet etching, dry etch, or any combinations thereof. The first insulating material 152 that is not in first void 130, as in FIG. 21, is removed. This removal may be done by any suitable way. Examples of ways to remove such first insulating material 134 include, but are not limited to, RIE, dry etch, or any combinations thereof. This produces a fin structure 154, as in FIG. 22, on semiconductor substrate 102. Thereafter, conventional processes for forming a FinFET can be followed.

Figure 23:
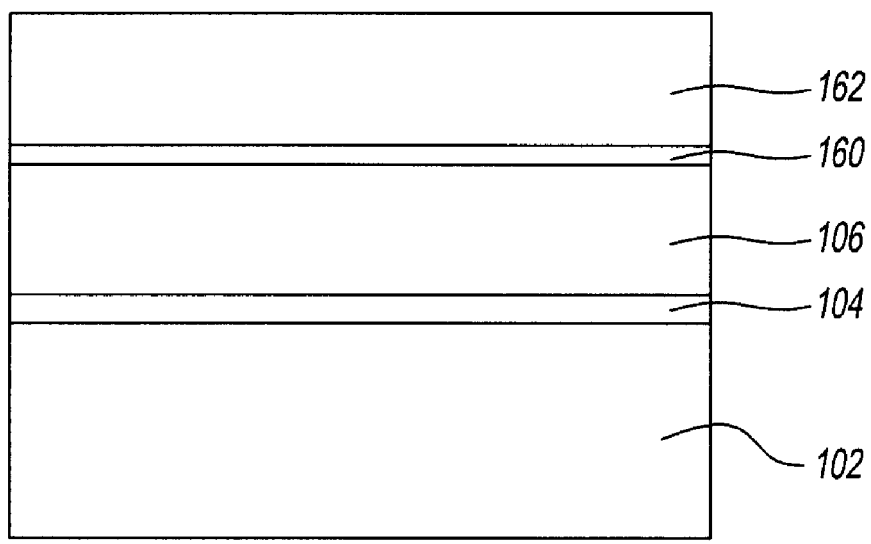
FIGS. 23 to 28 and 30 show cross sectional views and FIGS. 29 and 31 show top views, of portions of a semiconductor structure at various stages of yet another embodiment of a method of the present invention.

In yet another embodiment, an Si/SiGe/Si structure 100, as in FIG. 1, is provided. Referring to FIG. 23, on silicon layer 106 is deposited a first blocking layer 160. Examples of materials for use in or for the first blocking layer 160 include, but are not limited to, a nitride, oxide, or any combinations thereof. The layer thickness for first blocking layer 160 is from about 5 nm to about 20 nm. Preferably, the layer thickness for first blocking layer 160 is from about 8 nm to about 15 nm. More preferably, the layer thickness for first blocking layer 160 is from about 8 nm to about 10 nm.

On first blocking layer 160, opposite silicon layer 106, is deposited a first photoresist material 162. The layer thickness for first photoresist material 162 is from about 100 nm to about 400 nm. Preferably, the layer thickness for first photoresist material 162 is from about 150 nm to about 300 nm. More preferably, the layer thickness for first photoresist material 162 can be from about 200 nm to about 250 nm.

Figure 24:
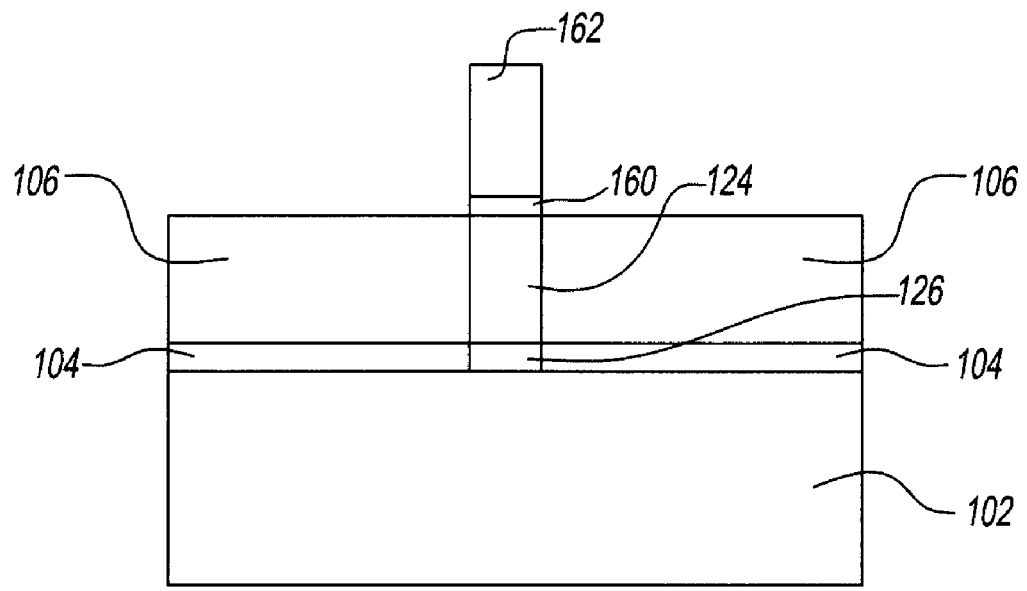

Referring to FIG. 24, the first photoresist material 162 is patterned to form the pattern of the desired fin structure with second portion 124 of silicon layer 106 and second portion 126 of SiGe layer 104 defined under the pattern.

The first blocking layer 160 not beneath the first photoresist material 162 is removed. The first blocking layer 160 may be removed by any suitable way. Examples of ways to remove first blocking layer 160 include, but are not limited to, RIE, dry etch, or any combinations thereof.

Figure 25:
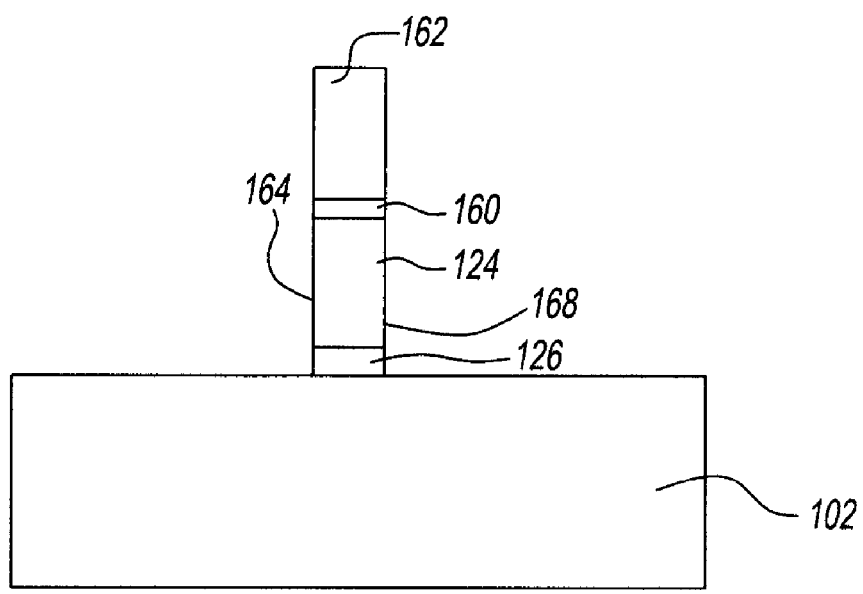

Referring to FIGS. 24 and 25, the silicon layer 106 not part of second portion 124 of silicon layer 106 and SiGe layer 104 not part of second portion 126 of SiGe layer 104 are removed by any suitable way to leave second portion 124 of silicon layer 106 having a first sidewall 164 and a second sidewall 168. The second portion 124 of silicon layer 106 is the fin portion that will be suspended above semiconductor substrate 102 in the steps below. Examples of ways for removing silicon layer 106 and SiGe layer 104 include, but are not limited to, RIE, dry etch, or any combinations thereof. Preferably, the removal of silicon layer 106 is selective to the material of SiGe layer 104 and the removal of SiGe layer 104 is selective to the material of semiconductor layer 102.

Figure 26:
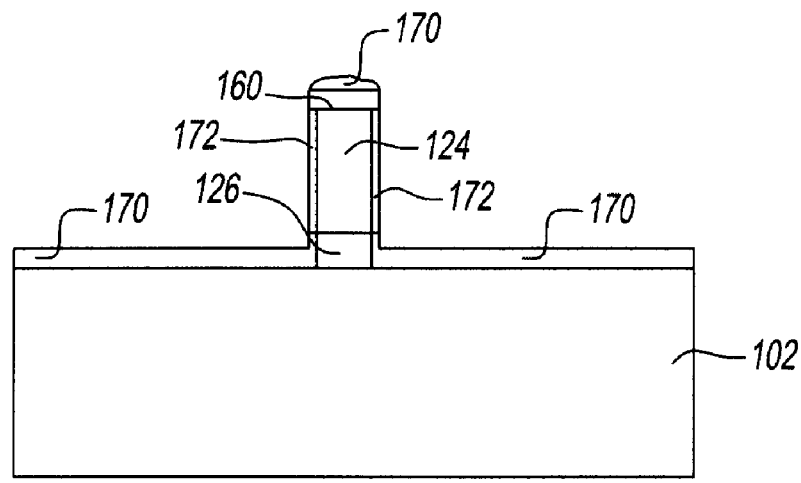

Referring to FIG. 26, the remaining first photoresist material 162, as in FIG. 25, is removed. Examples of suitable ways to remove first photoresist material 162 include, but are not limited to, etching.

Semiconductor substrate 102 and, optionally, first blocking layer 160, have a first insulating material 170 deposited thereon. Preferably, first insulating material 170 is deposited by high density plasma (HDP) deposition. This method results in thicker oxide on the top of semiconductor substrate 102 and first blocking layer 160, but thinner oxide on first and second sidewalls of second portion 124 of silicon layer 106. Examples of materials suitable for use in or for first insulating material 170 include, but are not limited to, an oxide, a nitride, or any combinations thereof. After the HDP, any first insulating material 170 on first and second sidewalls of second portion 124 of silicon layer 106 are removed to expose the sidewall for formation of gate insulating material 172.

The layer thickness for first insulating material 170 is from about 10 nm to about 50 nm. Preferably, the layer thickness for first insulating material 170 is from about 10 nm to about 30 nm. More preferably, the layer thickness for first insulating material 170 is from about 25 nm to about 30 nm.

On the first and second sidewalls of silicon fin 164 a gate insulating material 172, such as a gate-oxide, is formed. Examples of suitable ways to form gate insulating material 172 include, but are not limited to, oxidation, deposition of high-k dielectric, or any combinations thereof. Examples of materials suitable for use in or for gate insulating material 172 include, but are not limited to, an oxide, high-k material, or any combinations thereof. The layer thickness for gate insulating material 172 is from about 0.7 nm to about 3 nm. Preferably, the layer thickness for gate insulating material 172 is from about 0.8 nm to about 2 nm. More preferably, the layer thickness for gate insulating material 172 is from about 0.8 nm to about 0.9 nm.

Figure 27:
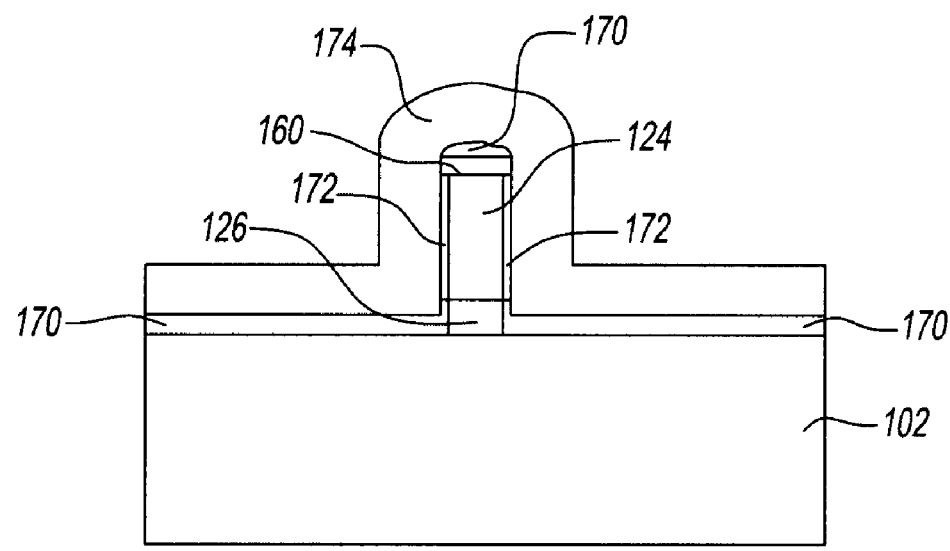

Referring to FIG. 27, a gate layer 174 is deposited. Examples of suitable ways to deposit gate layer 174 include, but are not limited to, chemical vapor deposition. Examples of materials suitable for use in or for gate layer 174 include, but are not limited to, poly-silicon, poly-silicon/germanium, or any combinations thereof. The layer thickness for gate layer 174 is from about 50 nm to about 200 nm. Preferably, the layer thickness for gate layer 174 is from about 70 nm to about 150 nm. More preferably, the layer thickness for gate layer 174 is from about 100 nm to about 120 nm.

Figure 28:
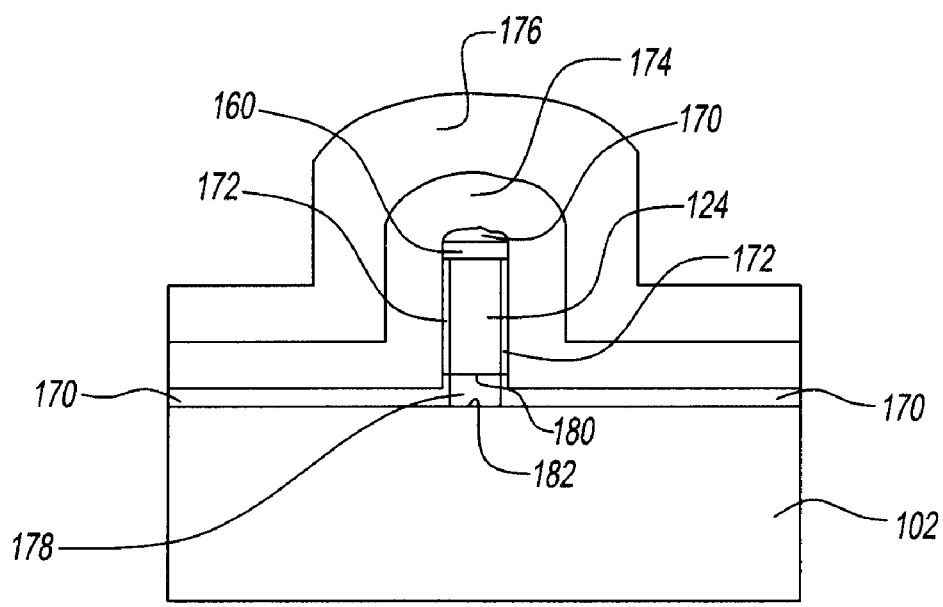
Figure 29:
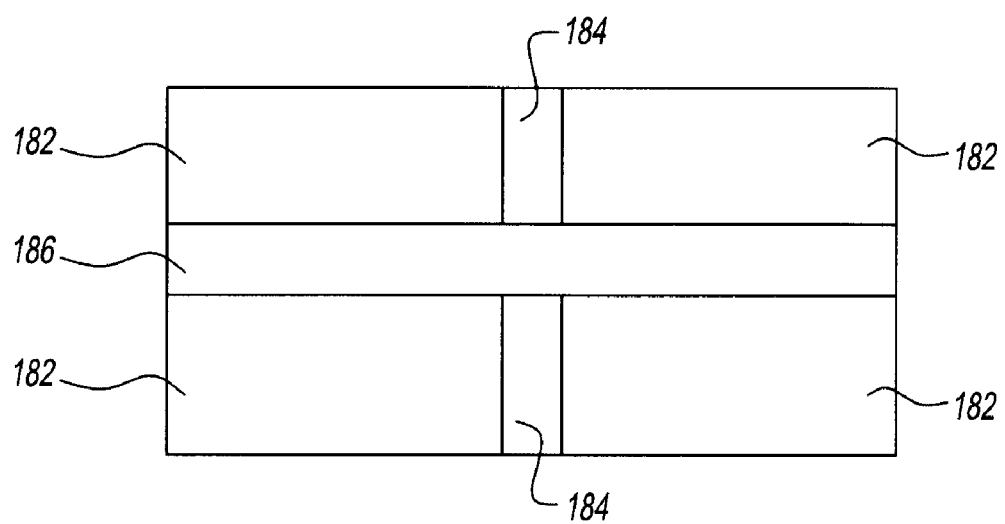

Referring to FIGS. 28 and 29, gate layer 174 has deposited thereon a second photoresist material 176. The second photoresist material 176 is patterned to define a gate region 186 thereunder for etching the gate material 174 and first insulating material 170 that is not part of the gate region 186 under the second photoresist material. The gate material 174 not covered by patterned second photoresist material 176 is removed. Examples of suitable ways to remove gate material 174 include, but are not limited to, RIE, dry etch, or any combinations thereof.

The first insulating material 170 not covered by patterned second photoresist material 176 is removed. Examples of suitable ways to remove first insulating material 170 include, but are not limited to, RIE, dry etch, or any combinations thereof. Preferably, the removal of first insulating material 170 is done selective to the material of semiconductor substrate 102.

The second portion 126 of SiGe layer 104, as shown in FIG. 27, is removed to produce a first void 178 having an upper boundary 180 defined by the lower surface of the second portion 124 of silicon layer 106 and a lower boundary 182 defined by a portion of the upper surface of the semiconductor substrate 102 that is underneath the second portion 124 of the silicon layer 106. The removal of the second portion 126 of SiGe layer 104 is preferably selective to the material of the semiconductor substrate 102 and the fin 124. Examples of suitable ways for removing second portion 126 of SiGe layer 104 include, but are not limited to, wet etching, dry etch, or any combinations thereof.

The structure provided by the gate layer 174, the gate insulating material 172, and first insulating material 170 suspend the second portion 124 of silicon layer 106 above the semiconductor substrate 120 with first void 178 in between.

FIG. 29 shows a top view of a semiconductor structure at this stage of the method. The top surface 182 of semiconductor substrate 102 is sectioned by the fin structure 184 and gate region 186. The top surface of the fin structure 184 has material of the first blocking layer. The top surface of the gate region 186 has material of the second photoresist. Referring to FIGS. 28 and 29, beneath the intersection of the fin structure 184 and gate region 186, and between the suspended second portion 124 of silicon layer 106 and semiconductor substrate 102, is the first void 178.

Conventional processes for preparing a FinFET can be followed either leaving first void 178 as a void or filling first void 178 with an insulating material, such as an oxide, a nitride, or low-k material. Leaving first void 178 as a void provides a low capacitance. If the void is filled by nitride, the completed FinFET has high heat conduction to the substrate due to high thermal conductivity of nitride.

In another aspect of a method of the present invention, as shown in FIG. 28, second photoresist material 176 can be removed before or after the creation of first void 178. Examples of suitable ways to remove second photoresist material 176 include, but are not limited to, etching.

Figure 30:
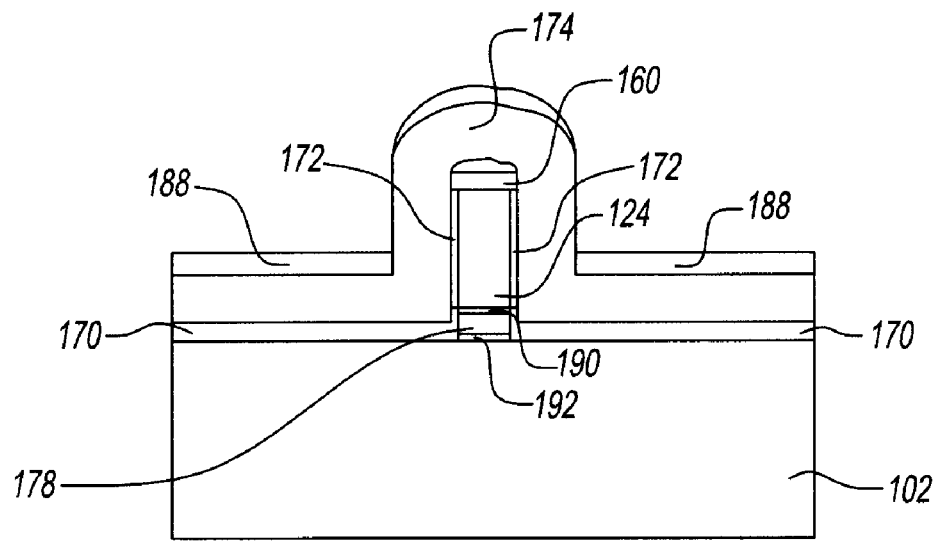
Figure 31:
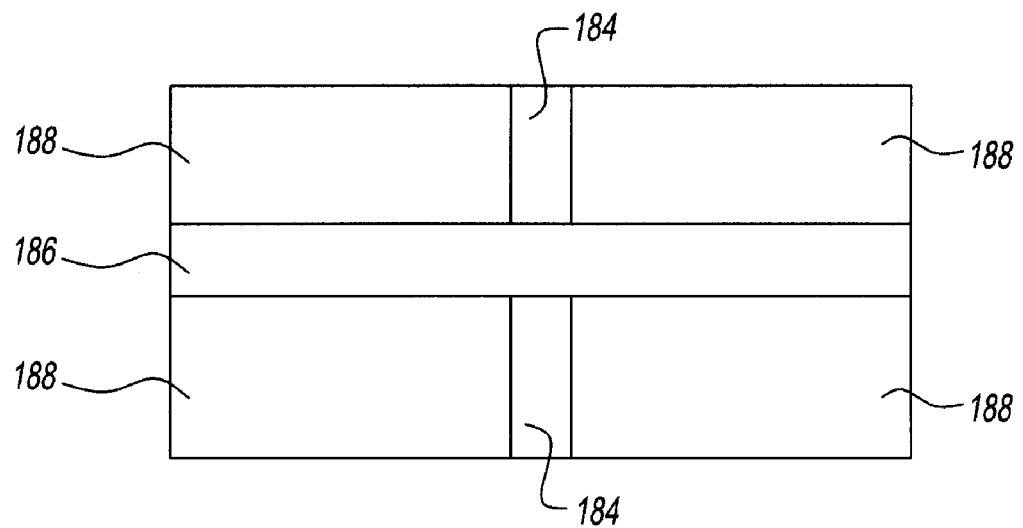

In another aspect of a method of the present invention, when leaving first void 178, as shown in FIG. 28, as a void, it is preferred that the upper boundary 180, and optionally lower boundary 182, of first void 178 be re-oxidized to protect the lower surface of the second portion 124 of silicon layer 106. FIG. 30 shows a cross sectional view and FIG. 31 shows a top view of a semiconductor substrate at this stage of a method of the present invention. FIG. 30 shows re-oxidized regions 190 and 192.

In yet another aspect of a method of the present invention, top surface 182 of semiconductor substrate 102, as shown in FIGS. 28 and 29, has deposited thereon a third insulating material. An examples of a suitable way to deposit third insulating material 188 includes HDP deposition in order to cover the surface of the substrate. Examples of suitable materials for use in or for third insulating material 188 include, but are not limited to, an oxide, nitride, or any combinations thereof. A preferred material for use in or for third insulating material 188 is an oxide. The layer thickness for third insulating material 188 can be from about 20 nm to about 50 nm.

The top surface of the fin structure 184 may also have deposited thereon third insulating material 188. A top surface of gate region 186 may also have deposited thereon third insulating material 188. Referring to FIGS. 30 and 31, beneath the intersection of the fin structure 184 and gate region 186, and between the suspended second portion 124 of silicon layer 106 and semiconductor substrate 102, is the first void 178.

The present invention has been described with particular reference to the preferred embodiments. It should be understood that the foregoing descriptions and examples are only illustrative of the invention. Various alternatives and modifications thereof can be devised by those skilled in the art without departing from the spirit and scope of the present invention. Accordingly, the present invention is intended to embrace all such alternatives, modifications, and variations that fall within the scope of the appended claims.

The invention claimed is:

1. A method of producing a fin structure, the method comprising:

providing a semiconductor substrate, an SiGe layer on said semiconductor substrate, and a silicon layer on said SiGe layer;

defining a fin portion of said silicon layer, said fin portion having thereunder a second portion of said SiGe layer;

forming a support structure attached to said fin portion and said semiconductor substrate;

removing said second portion to form a first void between said fin portion and said semiconductor substrate; and removing at least a portion of said support structure after forming said first void.

2. The method of claim 1, wherein said support structure comprises portions of said SiGe layer not part of said second portion, and portions of said silicon layer not part of said fin portion.

3. The method of claim 1, wherein said support structure comprises a spacer material.

4. The method of claim 3, wherein said spacer material is selected from the group consisting of nitride, oxide, oxynitride, and any combinations thereof.

5. The method of claim 1, wherein said support structure comprises a gate of a field effect transistor.

6. The method of claim 1, wherein said defining and forming steps are simultaneous.

7. The method of claim 6, wherein said support structure comprises portions of said SiGe layer not part of said second portion, and portions of said silicon layer not part of said fin portion.

8. The method of claim 7, wherein said defining and forming steps comprise:

depositing a first blocking layer on said silicon layer;

depositing a poly-silicon layer on said first blocking layer;

patterning said poly-silicon layer and said blocking layer to reveal a first portion of said silicon layer and a first portion of said SiGe layer, and producing a sidewall of said poly-silicon layer and a sidewall of said first blocking layer;

forming a first spacer on said sidewall of said poly-silicon layer and said sidewall of said first blocking layer to cover said fin portion and said second portion of said SiGe layer;

removing said first portion of said silicon layer to form a first sidewall of said silicon layer while said fin remains; and removing said first portion of said SiGe layer to form a first sidewall of said SiGe layer while said second portion of said SiGe layer remains.

9. The method of claim 7, wherein said defining and forming steps comprise:

depositing a first blocking layer on said silicon layer;

depositing a poly-silicon layer on said first blocking layer;

patterning said poly-silicon layer and said blocking layer to reveal a first portion of said silicon layer and a first portion of said SiGe layer, and producing a sidewall of said poly-silicon layer and a sidewall of said first blocking layer;

forming a first spacer on said sidewall of said poly-silicon layer and said sidewall of said first blocking layer to cover said fin portion and said second portion;

removing said first portion of said silicon layer to form a first sidewall of said silicon layer while said fin portion remains removing said SiGe layer to form a first sidewall of said SiGe layer while said second portion remains; and forming a second spacer on said sidewalls of said poly-silicon layer, said first blocking layer; said silicon layer, and said SiGe layer.

10. The method of claim 1, wherein said step of removing said second portion comprises selectively wet etching said second portion.

11. The method of claim 1, further comprising oxidizing said lower surface of said fin portion after removing said second portion.

12. The method of claim 1, wherein the fin structure forms a part of a field effect transistor.

13. A method of producing a fin structure, the method comprising:
- providing a semiconductor substrate, an SiGe layer on said semiconductor substrate, and a silicon layer on said SiGe layer;
- defining a fin portion of said silicon layer, said fin portion having thereunder a second portion of said SiGe layer;
- forming a support structure attached to said fin portion and said semiconductor substrate;
- removing said second portion, but not said support structure, to form a first void between said fin portion and said semiconductor substrate;
- depositing an insulating material in said first void; and
- removing said support structure.

14. The method of claim 13, wherein said insulating material is selected from the group consisting of an oxide, a nitride, oxynitride, low-k material, or any combinations thereof.

15. The method of claim 13, wherein said insulating material in said first void is asymmetrical.

16. A method of producing a fin structure, the method comprising:
- providing a semiconductor substrate, an SiGe layer on said semiconductor substrate, and a silicon layer on said SiGe layer;
- defining a fin portion of said silicon layer, said fin portion having thereunder a second portion of said SiGe layer;
- forming a support structure attached to said fin portion and said semiconductor substrate;
- removing said second portion to form a first void between said fin portion and said semiconductor substrate, wherein said step of removing said second portion comprises:
- removing said SiGe layer that is not part of said second portion;
- applying heat to induce oxidation of said second portion at a rate faster than the oxidation of said silicon layer and said semiconductor substrate to produce an oxidation material; and
- removing said oxidation material.

17. A method of producing a fin structure, the method comprising:
- providing a semiconductor substrate, an SiGe layer on said semiconductor substrate, and a silicon layer on said SiGe layer;
- defining a fin portion of said silicon layer, said fin portion having thereunder a second portion of said SiGe layer;
- forming a support structure attached to said fin portion and said semiconductor substrate;
- removing said second portion to form a first void between said fin portion and said semiconductor substrate, wherein said defining step comprises:
- depositing a first blocking layer on said silicon layer;
- depositing and patterning a first photoresist on said first blocking layer to form a pattern for said fin portion, said first photoresist defining said fin portion and said second portion thereunder; and
- removing said first blocking layer, said silicon layer and said SiGe layer to produce said fin portion having a first sidewall and a second sidewall.

18. The method of claim 17, wherein said forming step comprises:
- removing said first photoresist;
- depositing a first insulating material on said semiconductor substrate;
- depositing a gate insulating material on said first and second sidewalls;
- depositing a gate layer on said first insulating material and said gate insulating material;
- patterning a second photoresist defining a gate region thereunder; and
- removing said poly-silicon layer and said insulating material that is not part of said gate region.

* * * * *